United States Patent
Smith et al.

(10) Patent No.: US 7,315,254 B2
(45) Date of Patent: Jan. 1, 2008

(54) PROXIMITY DETECTOR FOR NIGHT VISION GOGGLES SHUT-OFF

(75) Inventors: William A. Smith, Daleville, VA (US); Mark E. Oesterreich, Roanoke, VA (US)

(73) Assignee: ITT Manufacturing Enterprises, Inc., Wilmington, DE (US)

(*) Notice: Subject to any disclaimer, the term of this patent is extended or adjusted under 35 U.S.C. 154(b) by 198 days.

(21) Appl. No.: 11/235,930

(22) Filed: Sep. 27, 2005

(65) Prior Publication Data

US 2007/0279238 A1    Dec. 6, 2007

(51) Int. Cl.
G08B 13/18 (2006.01)
G08B 13/26 (2006.01)
G08B 21/00 (2006.01)
G02F 1/01 (2006.01)
G02F 1/13 (2006.01)
H01J 31/49 (2006.01)
A42B 3/00 (2006.01)

(52) U.S. Cl. .......... 340/686.6; 340/555; 340/561; 340/562; 340/686.1; 250/330; 250/333; 250/334; 2/5; 2/6.1; 2/6.3

(58) Field of Classification Search .......... 340/555, 340/561, 562, 686.1, 686.6; 250/330, 331, 250/332, 334, 333; 2/5, 6.1, 6.3
See application file for complete search history.

(56) References Cited

U.S. PATENT DOCUMENTS

| 4,132,889 A | 1/1979 | Groeneweg |
| 4,672,194 A * | 6/1987 | Kastendieck et al. .. 250/214 VT |
| 4,755,725 A * | 7/1988 | Kastendieck et al. ....... 315/360 |
| 5,408,086 A | 4/1995 | Morris et al. |
| 5,467,479 A | 11/1995 | Mattes |
| 5,469,578 A | 11/1995 | Mattes |
| 5,506,730 A | 4/1996 | Morley et al. |
| 5,703,354 A | 12/1997 | Wannagot et al. |
| 5,786,932 A * | 7/1998 | Pniel ......................... 359/409 |
| 5,822,126 A | 10/1998 | Cursolle et al. |
| 5,914,816 A | 6/1999 | Soto et al. |
| 6,087,660 A | 7/2000 | Morris et al. |
| 6,088,165 A * | 7/2000 | Janeczko et al. .......... 359/629 |
| 6,208,461 B1 | 3/2001 | Gaber |

(Continued)

FOREIGN PATENT DOCUMENTS

WO    WO 95/07489    3/1995

OTHER PUBLICATIONS

American Technologies Network Corp., "Night Scout User's Guide" 2001, United States of America.

(Continued)

Primary Examiner—Benjamin C. Lee
Assistant Examiner—Lam Pham
(74) Attorney, Agent, or Firm—RatnerPrestia

(57) ABSTRACT

A night vision device is disclosed. The device includes a housing that houses an intensifier tube and a proximity sensor mounted on the housing. An ON/OFF switch is operatively coupled to the intensifier tube and to the proximity sensor such that operation of the ON/OFF switch to the "ON" position automatically activates the proximity sensor. A method of operating the night vision device with the proximity sensor is also disclosed.

9 Claims, 4 Drawing Sheets

U.S. PATENT DOCUMENTS

| | | | |
|---|---|---|---|
| 6,288,386 B1 * | 9/2001 | Bowen et al. | 250/214 VT |
| 6,307,384 B2 * | 10/2001 | Havey et al. | 324/662 |
| 6,350,031 B1 * | 2/2002 | Lashkari et al. | 351/221 |
| 6,457,179 B1 | 10/2002 | Prendergast | |
| 6,472,776 B1 | 10/2002 | Soto et al. | |
| 6,487,809 B1 | 12/2002 | Gaber | |
| 6,516,551 B2 | 2/2003 | Gaber | |
| 6,608,298 B2 | 8/2003 | Gaber | |
| 6,862,748 B2 | 3/2005 | Prendergast | |
| 6,898,890 B2 | 5/2005 | Gaber | |
| 6,937,221 B2 * | 8/2005 | Lippert et al. | 345/98 |

OTHER PUBLICATIONS

American Technologies Network Corp., "Night Jaguar User's Guide" 2001, United States of America.

American Technologies Network Corp., "Night Cougar User's Guide" 2002, United States of America.

OIP Sensor Systems, "LORIS Monocular Night Vision Devices" web site, Mar. 11, 2005.

* cited by examiner

PROXIMITY DETECTOR FOR NIGHT VISION GOGGLES SHUT-OFF

BACKGROUND OF THE INVENTION

Night vision devices, such as night vision goggles (NVG's) are well known for being able to enable a user of such a device to easily see in darkened environments. These devices are often used in military applications to enable soldiers to see without the use of extraneous visible lighting, such as flashlights, which may give away their position to the enemy. The NVG intensifies the available low-level ambient light, and provides an image having a generally greenish glow that enables the user to see his surroundings.

The NVG is often mounted on a soldier's helmet and is movable between an operational position in front of the soldier's eyes, and a stowed position, such as above the soldier's eyes. However, in the stowed position, the eyepieces are generally directed outward, away from the soldier, and it may be possible for an enemy to see the green glow from the eyepieces, thus giving away the soldier's position.

To counter this problem, magnets have been incorporated in the helmet is mount so that, when the NVG is in its use position, the magnetic field generated by the magnet activates a magnetically operable switchpot, turning the NVG "ON". When the NVG is flipped to is stowed position, the magnet slides within its housing away from the magnetic switchpot, removing the magnetic field, and turning the NVG "OFF". However, problems exist with this technology. When the soldier is not looking in a level direction, but is looking up or down, the magnet may inadvertently slide to the "OFF" position, rendering the NVG inoperable at an inopportune time. Additionally, if the soldier is rolling or tumbling, the magnet may again slide to the "OFF" position. Further, the magnet slides within its housing with an audible "click" that may disturb soldiers fearful of generating any sound whatsoever that may give away their position to the enemy.

It would be beneficial to provide a method of maintaining the NVG in the "ON" position when the NVG is in front of the soldier's eyes, regardless of the soldier's orientation, yet automatically switchpot to the "OFF" position when the NVG is moved away from the soldier's eyes.

SUMMARY OF THE INVENTION

Briefly, the present invention provides a night vision device. The device includes a housing that houses an intensifier tube and a proximity sensor mounted on the housing. An ON/OFF switch is operatively coupled to the intensifier tube and to the proximity sensor such that operation of the ON/OFF switch to the "ON" position automatically activates the proximity sensor.

Additionally, the present invention provides a method of operating a night vision device. The device comprises a housing that houses an intensifier tube and a proximity sensor mounted on the housing. An ON/OFF switch is operatively coupled to the intensifier tube and to the proximity sensor. The method comprises the step of turning only the ON/OFF switch to the ON position and activating both the intensifier tube and the proximity sensor.

Further, the present invention provides a method of operating a night vision device. The device comprises a device housing that houses an intensifier tube and a proximity sensor mounted on the device housing. An ON/OFF switch is operatively coupled to the intensifier tube and to the proximity sensor. The method comprises the steps of mounting the night vision device on a support; turning the ON/OFF switch to the ON position; moving the proximity sensor to a close proximity of a body to activate the intensifier tube; and removing the proximity sensor from a close proximity of the body to deactivate the intensifier tube.

Also, the present invention provides a night vision assembly comprising a support structure and a night vision device mounted on the support structure. The night vision device comprises a device housing that houses an intensifier tube and a proximity sensor mounted on the device housing. The proximity sensor is operatively coupled to the intensifier tube. An ON/OFF switch is operatively coupled to the intensifier tubes and to the proximity sensor such that operation of the ON/OFF switch to the "ON" position automatically activates the proximity sensor.

BRIEF DESCRIPTION OF THE DRAWINGS

The foregoing summary, as well as the following detailed description preferred embodiments of the invention, will be better understood when read in conjunction with the appended drawings, which are incorporated herein and constitute part of this specification. For the purposes of illustrating the invention, there are shown in the drawings embodiments that are presently preferred. It should be understood, however, that the invention is not limited to the precise arrangements and instrumentalities shown. In the drawings, the same reference numerals are employed for designating the same elements throughout the several figures. In the drawings.

DETAILED DESCRIPTION OF THE INVENTION

Certain terminology is used herein for convenience only and is not to be taken as a limitation on the present invention. The terminology includes the words specifically mentioned, derivatives thereof and words of similar import. As used herein, the term "rear" is defined to mean a direction closer to a user when the night vision device is in a use position as described herein and "front" is defined to mean a direction farther from a user when the night vision device is in a use position as described herein. The following describes preferred embodiments of the invention. However, it should be understood based on this disclosure, that the invention is not limited by the preferred embodiments of the invention.

Referring to the figures in general, a night vision device according to the several embodiments of the present invention is disclosed. The device includes a proximity sensor comprised of an infrared emitter and detector assembly that is used to detect when the night vision device is in close proximity to a user. When the night vision device is within a predetermined distance of the user, the proximity sensor allows the night vision device to operate, but when the night vision device is outside of the predetermined range, the proximity sensor will not allow the night vision device to operate.

Figure 1:
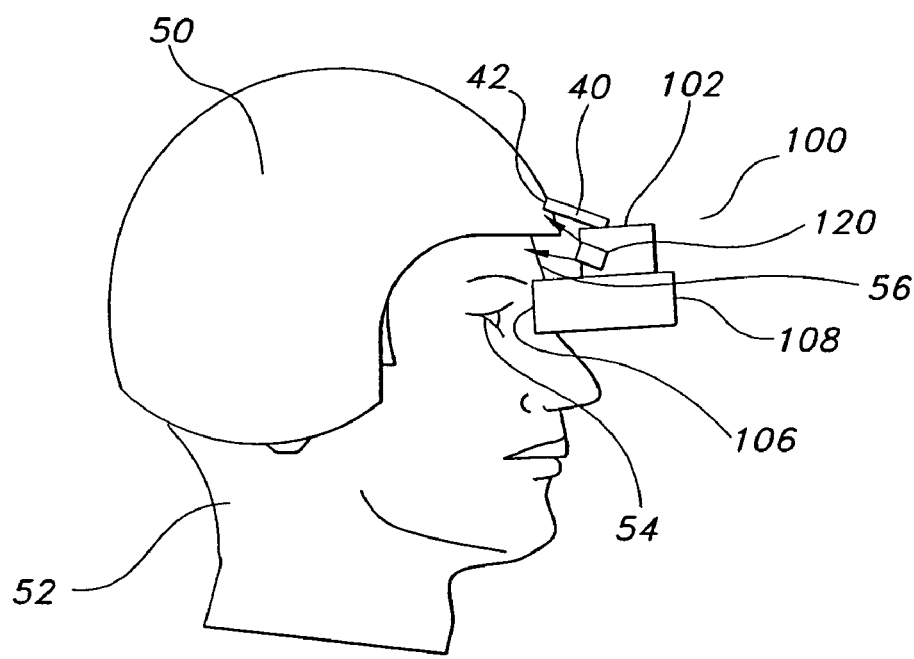
FIG. 1 is a schematic view of a night vision device with proximity sensor according to a first embodiment of the present invention in a "use" position.
Figure 2:
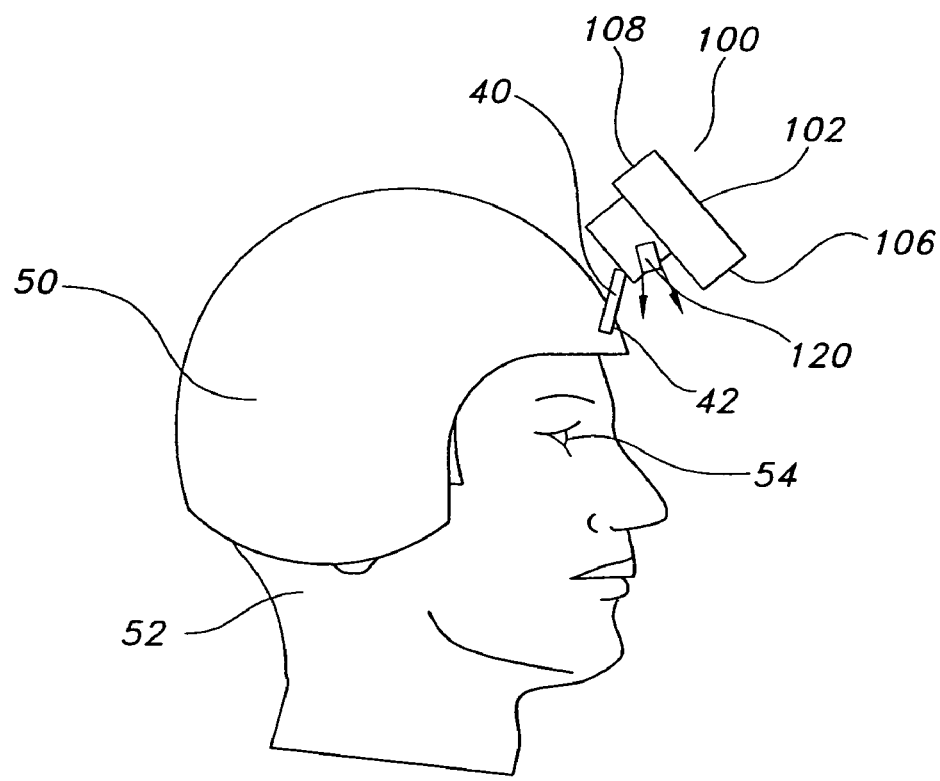
FIG. 2 is a schematic view of the night vision device with proximity sensor in a "stowed" position.

Referring now in particular to FIG. 1, a night vision device 100 according to the present invention is shown. The night vision device 100 is preferably mounted on a support bracket 40 that is fixed to a helmet 50 of a user 52, such as a soldier. The support bracket 40 preferably includes a pivoting mount 42 that allows the user 52 to move the night vision device 100 between a first position, when the night vision device 100 is aligned for use with the eyes 54 of the user 52, and a second position, shown in FIG. 2, when the night vision device 100 is moved away from the eyes 54 of the user 52 in a non-use, or stowed, position. As seen in FIG. 2, a common location of the second position is above the eyes 54 of the user 52, toward the top of the head of the user 52.

Figure 3:
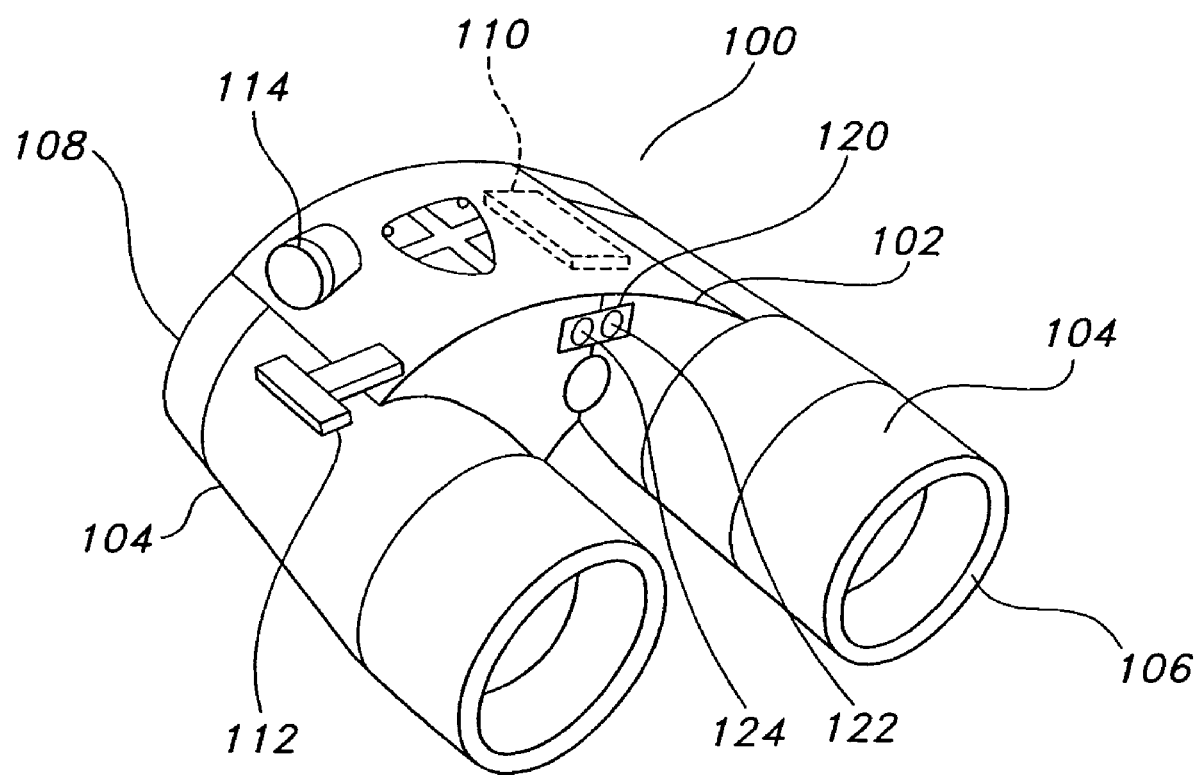
FIG. 3 is a perspective view of the night vision device with proximity sensor.

Referring now to FIG. 3, the night vision device 100 includes a housing 102 that houses intensifier tubes 104 that are used to intensify the image being observed through the device 100. As shown in FIG. 3, two intensifier tubes 104 are used, making the night vision device 100 a binocular device. However, those skilled in the art will recognize that only one intensifier tube 104 need be used, making the device a monocular device. Such a monocular device is described below with reference to a night vision device 200.

Referring to both FIGS. 1 and 3, the housing 102 also has a rear portion 106 that faces the user 52 and a front portion 108 that faces away from the user 52. The intensifier tubes 104 enable the user 52 to see objects in a low light environment, such as in a darkened room or at night. The intensifier tubes 104 are powered by a power source 110. Preferably, the power source is a single 1.5 volt DC battery, although those skilled in the art will recognize that any number of batteries and other voltages may be used.

A main ON/OFF/VARIABLE GAIN switchpot 114 provides an electrical connection between the power source 110 and the intensifier tubes 104 and varies the gain of the intensifier tubes 104. While an ON/OFF/VARIABLE GAIN switchpot 114 is desired, those skilled in the art will recognize that an ON/OFF switch may be used instead. A separate ON/OFF/MOMENTARY ON switch 112 operates to either turn an infrared LED ON, OFF, or MOMENTARY ON to provide illumination for the night vision device 100 in extremely low light conditions.

A proximity sensor 120 is also mounted on the housing 102. As shown in FIG. 3, the proximity sensor 120 is mounted on the rear portion 106 of the housing 102. The proximity sensor 120 is comprised of an infrared emitter 122 and a corresponding infrared detector 124 that is tuned to pick up the particular wavelength of light that is emitted from the infrared emitter 122.

When the night vision device 100 is in the first, or use, position, as shown in FIG. 1, the proximity sensor 120 is activated, sending an output signal to the intensifier tubes 104, to turn the intensifier tubes 104 on. When the intensifier tubes 104 are on, the intensifier tubes 104 emit a greenish glow that, in a darkened environment, can be seen over a great distance. However, the proximity sensor 120 ensures that the intensifier tubes 104 only emit the glow when the night vision device 100 is in the first position and the glow is directed into the user's eyes 54. When the night vision device 100 is in the second, or stowed, position, as shown in FIG. 2, the proximity sensor 120 is deactivated, and the output signal is not sent to the intensifier tubes 104. The intensifier tubes 104, therefore, turn off, and the greenish glow is not emitted from the intensifier tubes 104.

Figure 4:
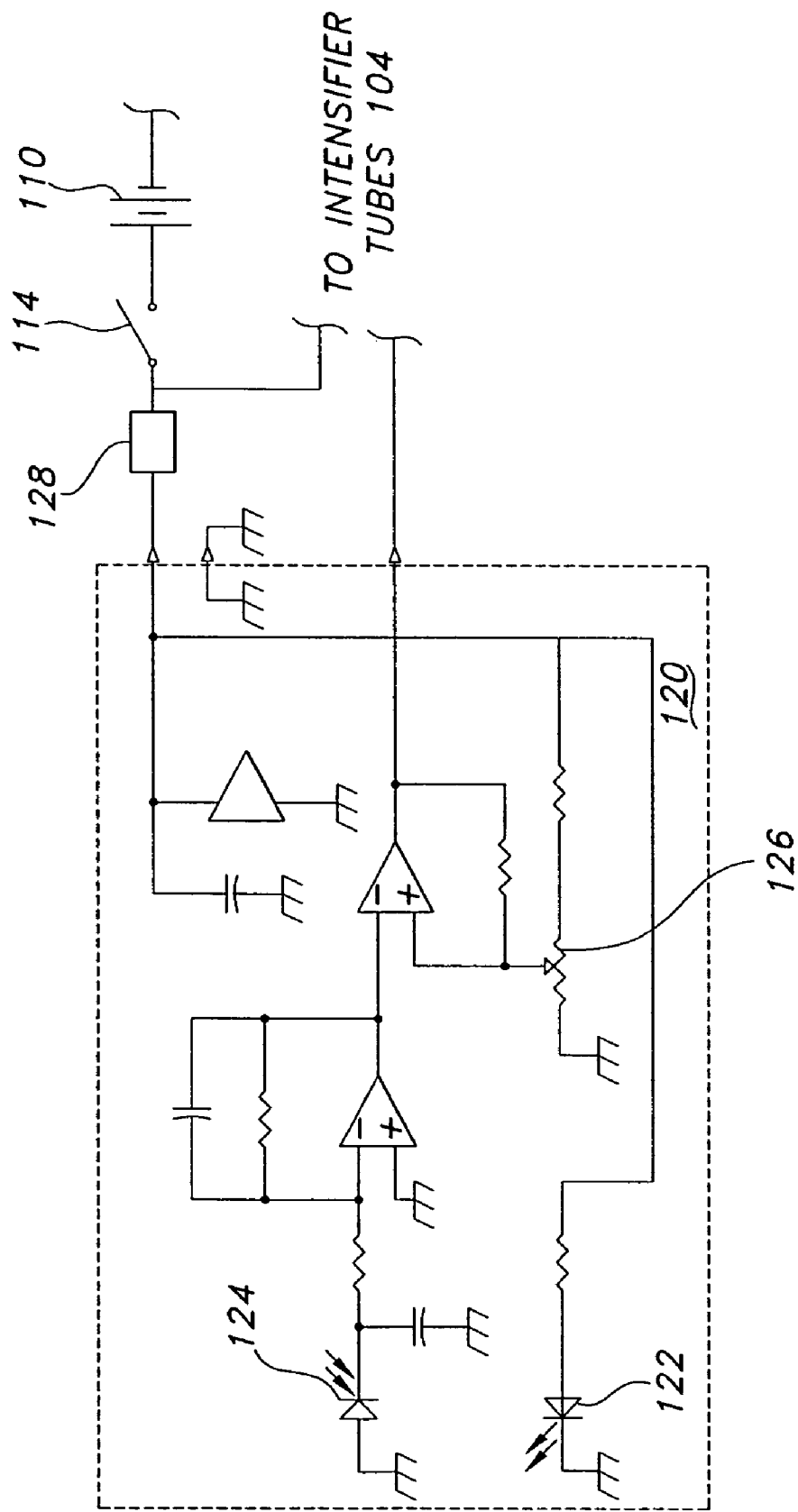
FIG. 4 is an electrical schematic of the proximity sensor used in the night vision device.

An electrical schematic of the proximity sensor 120 is shown in FIG. 4. The proximity sensor 120 is comprised of the infrared emitter 122 and the infrared detector 124, as well as an adjustment potentiometer ("pot") 126 that adjusts the sensitivity of the proximity sensor 120. The infrared emitter 122 emits a low power infrared signal that must be detected by the infrared detector 124 in order to activate the intensifier tubes 104. The infrared emitter 122 may be an LED or any other suitable source for emitting infrared light. Preferably, the infrared emitter 122 emits an infrared light having a wavelength of at least 900 nm. The infrared detector 124 is tuned to detect light waves that are transmitted at the infrared emitter wavelength.

The operational threshold of the proximity sensor 120 is set by adjustment of the adjustment pot 126. Once the appropriate operational threshold is determined, based on the required sensing range and types of reflective surfaces applicable to the anticipated usage scenarios, the adjustment pot 126 may optionally be eliminated in production units and replaced with a fixed resistor (not shown).

An optical filter (not shown) may optionally be included in front or, or as part of the infrared detector 124 to further tune the sensitivity of the infrared detector 124 to match the infrared emitter 122 and to reject ambient light at extraneous wavelengths. In addition, the infrared emitter 122 can be modulated or pulsed "ON" and "OFF", and the circuit comprising the proximity sensor 120 can be arranged to be sensitive to this modulation or pulsing pattern in order to reduce the required power, improve the sensitivity, and/or better reject the interference of ambient light.

Preferably, input power of approximately 2.7 volts (nominal) powers the infrared emitter 122. A voltage step up 128 steps up the voltage from 1.5 volts to about 2.7 volts to operate the proximity sensor 120 and the intensifier tubes 104. The power is provided to the infrared emitter 122 through activation of the ON/OFF/VARIABLE GAIN switchpot 114. The ON/OFF/VARIABLE GAIN switchpot 114 provides direct power to both the intensifier tubes 104 as well as the proximity sensor 120, without the need for a separate ON/OFF/VARIABLE GAIN switchpot for the proximity sensor 120.

FIG. 4 shows the infrared emitter 122 supplied with a fixed operating power. However, those skilled in the art will recognize that the power to the infrared emitter 122 may alternatively be reduced in response to the level of detected power in order to reduce the infrared signature and power consumption of the proximity sensor 120.

When the night vision device 100 is brought to the use position in front of the wearer's eyes for use, as shown in FIG. 1, the infrared light emitted from the infrared emitter 122 impinges on a reflective surface, such as the wearer's forehead 56 or the helmet 50. Preferably, the infrared light impinges on only a small area, such as approximately 100 $mm^2$ or less. The infrared light reflects from the surface 50, 56 and is detected by the infrared detector 124.

Preferably, through use of the adjustment pot 126, the infrared detector 124 is sufficiently sensitive to be able to detect the reflected infrared light from a range of approximately 76.2 mm (3 inches) from the reflective surface 50, 56 to the infrared detector 124. Therefore, when the night vision device 100 is in the use position, the infrared detector 124 easily picks up the infrared light, allowing the intensifier tubes 104 to be powered up.

When the night vision device 100 is pivoted about the pivoting mount 42 to the stowed position, as shown in FIG. 2, the infrared light emitted from the infrared emitter 122 does not impinge upon any surface, resulting in the infrared light not being detected by the infrared detector 124. Since the infrared detector 124 does not detect the infrared light signal, the intensifier tubes 104 will not power up. Since the intensifier tubes 104 are not powered up, the distinctive green glow will not be emitted from the intensifier tubes 104.

If the night vision device 100 is in the use position and is powered up, and then is moved to the stowed position, the infrared signal will drop below an operational threshold. If the infrared signal drops below that threshold for a predetermined period of time, such as about 0.1 second, the intensifier tubes 104 turn off. If the device 100 is then moved back to the use position, the infrared detector 124 will reacquire the infrared signal as the infrared signal reflects from the user's forehead 56 or the helmet 50 to the infrared detector 124, allowing the intensifier tubes 104 to turn back on. Preferably, the time from reacquisition of the infrared signal to full power up of the intensifier tubes 104 is about 0.1 second.

Figure 5:
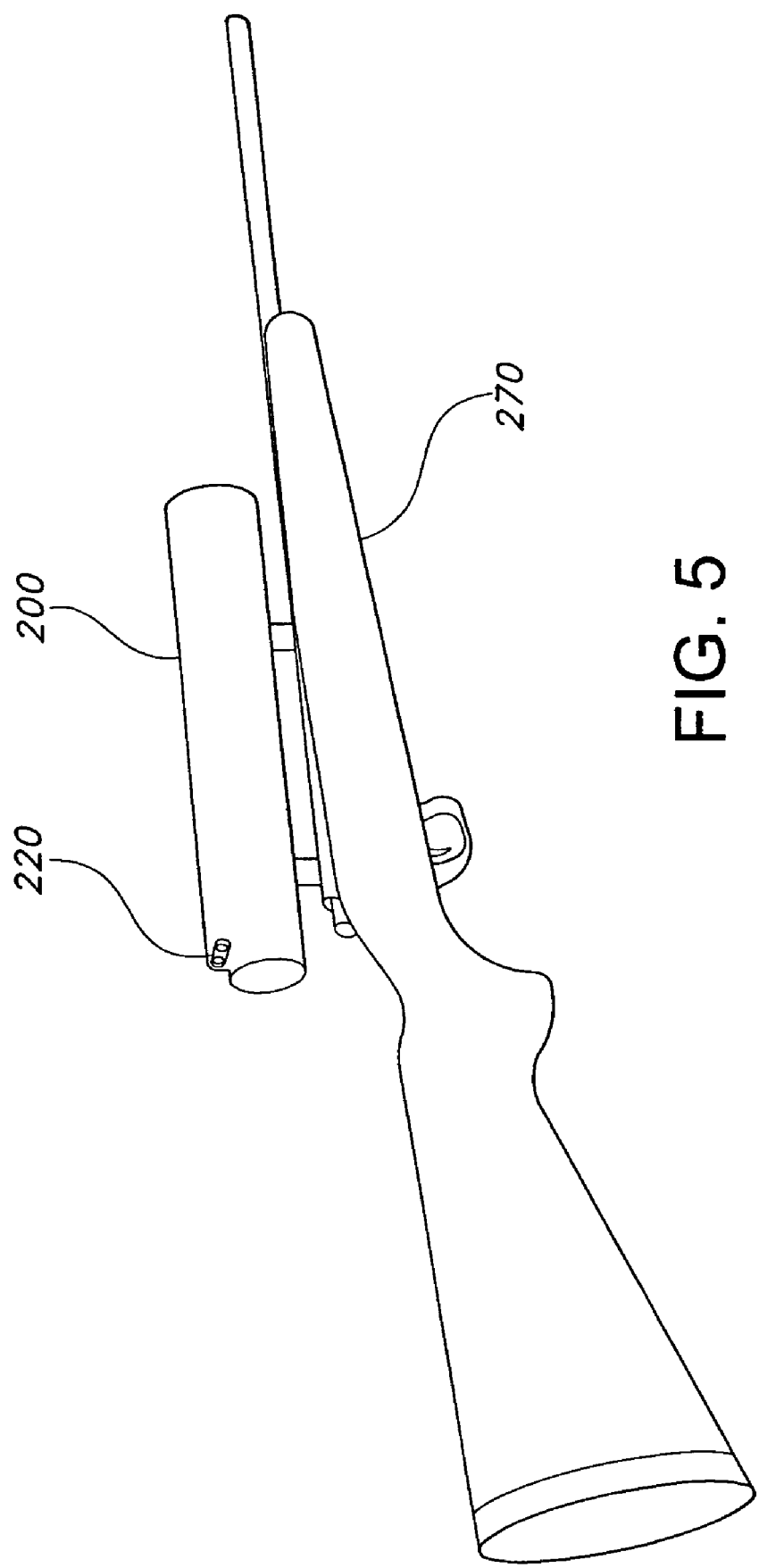
FIG. 5 is a perspective view of a night vision device with proximity sensor according to a second embodiment of the present invention, with the night vision device mounted on a rifle.

In an alternate embodiment, shown in FIG. 5, a night vision device 200 is mounted on a rifle 210. While the night vision device 100 is shown as binoculars, the night vision device 200 shown in FIG. 5 is shown as a monocular scope. Further, while the night vision device 200 is shown mounted on the rifle 210, those skilled in the art will recognize that the night vision device 200 may be mounted on a handgun, a rocket launcher, or any other suitable firearm.

The night vision device 200 includes a proximity sensor 220 that operates in the same manner as proximity sensor 120 on the night vision device 100 described above, except that, instead of moving the night vision device 100 toward the user's face by pivoting the night vision device 100 about a support structure to activate the proximity sensor 120, to activate the night vision device 200, the user moves the rifle 210 and the night vision device 200 up to the user's face to activate the proximity sensor 220.

While the night vision device 100 is described as being used with the helmet 52 and the night vision device 200 is described as being used with the rifle 210, those skilled in the art will recognize that the night vision device 100 may alternately be used in other environments, such as mounted in an aircraft cockpit, or hand-held, without departing from the scope of the present invention.

Additionally, while proximity sensors 120, 220 are shown and described as infrared detectors, those skilled in the art will recognize that other types of detectors, such as ultrasonic, microwave, radio wave, millimeter wave, terahertz wave, and ultraviolet wave detectors, may be used in place of the infrared detector.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A night vision device comprising:
   a housing, wherein the housing houses an intensifier tube;
   a proximity sensor mounted on the housing;
   an ON/OFF switch operatively coupled to the intensifier tube and to the proximity sensor, wherein operation of the ON/OFF switch to the "ON" position automatically activates the proximity sensor; and
   the proximity sensor comprises an infrared emitter electrically coupled to the ON/OFF switch and an infrared detector disposed to receive a signal emitted from the infrared emitter and reflected from a body;
   wherein the housing is mounted on a fixture and the housing is pivotably movable on the fixture between a first position, wherein the proximity sensor is within an activation distance of the body, and a second position, wherein the proximity sensor is not within activation distance of the body, and
   the infrared detector is pivoted to the first position for receiving the signal emitted from the infrared emitter and reflected from the body, and the infrared detector is pivoted to the second position for not receiving a reflection from the body.

2. The night vision device according to claim 1, wherein the infrared emitter operates at a wavelength of at least 900 nanometers.

3. The night vision device according to claim 1, wherein the fixture comprises a helmet.

4. The night vision device according to claim 1, wherein the fixture comprises a rifle.

5. A method of operating a night vision device comprising a housing, wherein the housing houses an intensifier tube; a proximity sensor mounted on the housing; and an ON/OFF switch operatively coupled to the intensifier tube and to the proximity sensor, wherein the method comprises the steps of:
   pivotally mounting the night vision device on a support;
   turning the ON/OFF switch to the ON position;
   pivoting the proximity sensor to a close proximity of a body to activate the intensifier tube; and
   pivoting the proximity sensor from a close proximity of the body to deactivate the intensifier tube.

6. A night vision device comprising:
   a support structure;
   a night vision device mounted on the support structure and pivotably movable relative to the support structure between a first position and a second position, wherein the night vision device comprises:
   a housing, wherein the housing houses an intensifier tube;
   a proximity sensor mounted on the housing, wherein the proximity sensor is operatively coupled to the intensifier tube and includes an infrared emitter and detector; and
   an ON/OFF switch operatively coupled to the intensifier tube and to the proximity sensor, wherein operation of the ON/OFF switch to the "ON" position automatically activates both the intensifier tube and the proximity sensor;
   wherein the infrared detector is pivoted to the first position for receiving a signal emitted from the infrared emitter and reflected from a body, and the infrared detector is pivoted to the second position for not receiving a reflection from the body.

7. The night vision device according to claim 6, wherein, when the night vision device is in the first position and the ON/OFF switch is in the ON position, the proximity sensor activates the intensifier tube.

8. The night vision device according to claim 7, wherein, when the night vision device is in the second position and the ON/OFF switch is in the ON position, the proximity sensor deactivates the intensifier tube.

9. A night vision assembly comprising:
   a support structure; and
   a night vision device mounted on the support structure, wherein the night vision device comprises:
   a housing, wherein the housing houses an intensifier tube;
   a proximity sensor mounted on the housing, wherein the proximity sensor is operatively coupled to the intensifier tube; and
   an ON/OFF switch operatively coupled to the intensifier tubes and to the proximity sensor, wherein operation of the ON/OFF switch to the "ON" position automatically activates the proximity sensor;

wherein, when the proximity sensor mounted on the support structure is proximate to an activating body, the proximity sensor activates the intensifier tube, and when the proximity sensor mounted on the support structure is distal from the activating body, the proximity sensor deactivates the intensifier tube.

\* \* \* \* \*